United States Patent
Hong et al.

(10) Patent No.: US 7,169,271 B2
(45) Date of Patent: Jan. 30, 2007

(54) MAGNETRON EXECUTING PLANETARY MOTION ADJACENT A SPUTTERING TARGET

(75) Inventors: Ilyoung Richard Hong, San Jose, CA (US); James Tsung, San Jose, CA (US); Daniel Clarence Lubben, San Jose, CA (US); Peijun Ding, San Jose, CA (US); Nirmalya Maity, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/862,257

(22) Filed: Jun. 7, 2004

(65) Prior Publication Data

US 2004/0222087 A1    Nov. 11, 2004

Related U.S. Application Data

(63) Continuation of application No. 10/152,494, filed on May 21, 2002, now Pat. No. 6,841,050.

(51) Int. Cl.
*C23C 14/35* (2006.01)
(52) U.S. Cl. .............................. 204/298.2; 204/192.12
(58) Field of Classification Search ........... 204/192.12, 204/298.19, 298.2
See application file for complete search history.

(56) References Cited

U.S. PATENT DOCUMENTS

| | | | |
|---|---|---|---|
| 4,426,264 A | 1/1984 | Münz et al. | 204/192 R |
| 4,444,643 A | 4/1984 | Garrett | 204/298 |
| 4,714,536 A * | 12/1987 | Freeman et al. | 204/298.2 |
| 4,853,102 A | 8/1989 | Tateishi | 204/298.15 |
| 5,126,029 A | 6/1992 | Tomer et al. | 204/192.12 |
| 5,188,717 A | 2/1993 | Broadbent et al. | 204/192.12 |

(Continued)

FOREIGN PATENT DOCUMENTS

EP    1 067 577    1/2001

(Continued)

OTHER PUBLICATIONS

J. Musil et al., "Unbalanced magnetrons and new sputtering systems with enhanced plasma ionization", *J. Vac. Sci. Technol. A*, vol. 9, No. 3, May/Jun. 1991, 1171-1177 pp.

(Continued)

*Primary Examiner*—Rodney G. McDonald
(74) *Attorney, Agent, or Firm*—Charles S. Guenzer

(57) ABSTRACT

A small magnet assembly is scanned in a retrograde planetary or epicyclic path about the back of a target being plasma sputtered including an orbital rotation about the center axis of the target and a planetary rotation about another axis rotating about the target center axis. The magnet assembly passes through the target center, thus allowing full target coverage. A properly chosen ratio of the two rotations about respective axes produces a much slower magnet velocity near the target periphery than at the target center. A geared planetary mechanism includes a rotating drive plate, a fixed center gear, and an idler and a follower gear rotatably supported in the drive plane supporting a cantilevered magnet assembly on the side of the drive plate facing the target. A belted planetary mechanism includes a fixed center capstan, a follower pulley supporting the magnet assembly, and a belt wrapped around them.

21 Claims, 10 Drawing Sheets

U.S. PATENT DOCUMENTS

| | | | |
|---|---|---|---|
| 5,865,961 A | 2/1999 | Yokoyama et al. | 204/192.12 |
| 5,944,968 A * | 8/1999 | Kobayashi et al. | 204/298.2 |
| 6,183,614 B1 | 2/2001 | Fu | 204/298.2 |
| 6,322,679 B1 | 11/2001 | De Bosscher et al. | 204/298.2 |
| 6,416,639 B1 | 7/2002 | De Bosscher et al. | 204/298.2 |
| 6,841,050 B1 * | 1/2005 | Hong et al. | 204/298.2 |
| 6,852,202 B1 * | 2/2005 | Miller et al. | 204/192.13 |

FOREIGN PATENT DOCUMENTS

| | | | |
|---|---|---|---|
| JP | 61-157678 | | 7/1986 |
| JP | 3-140467 | | 6/1991 |
| JP | 5-1373 | | 1/1993 |
| JP | 11-074225 | * | 3/1999 |
| WO | WO 90/13137 | | 11/1990 |

OTHER PUBLICATIONS

PCt/US03/15620, International Search Report, 7 pp.

* cited by examiner

MAGNETRON EXECUTING PLANETARY MOTION ADJACENT A SPUTTERING TARGET

RELATED APPLICATION

This application is a continuation of Ser. No. 10/152,494, filed May 21, 2002, now issued as U.S. Pat. No. 6,841,050.

FIELD OF THE INVENTION

The invention relates generally to sputtering of materials. In particular, the invention relates to the magnetron creating a magnetic field to enhance plasma sputtering.

BACKGROUND ART

Sputtering, alternatively called physical vapor deposition (PVD), is commonly used in the fabrication of semiconductor integrated circuits for depositing layers of metals and related materials particularly for the formation of electrical interconnections. Somewhat older integrated circuit technology uses aluminum for horizontal interconnects and for vertical interconnects between metallization levels through vias having relatively modest aspect ratios. Such applications require fast deposition rates and high uniformity that are easily achievable with sputtering. The fast deposition rate has been achieved in part by magnetron plasma sputtering in which a working gas, for example, of argon is excited into a plasma. The positively charged ions are attracted to a negatively biased metallic target and strike it with sufficient energy to dislodge (sputter) metal atoms from the target, which then coat a wafer positioned in opposition to the target. The sputtering rate is enhanced by positioning a magnet assembly in back of the target which creates a magnetic field parallel to the front face of the target. The magnetic field traps electrons, which increases the plasma density and hence the sputtering rate. The most prevalent type of magnetron in commercial fabrication uses a series of horseshoe or similar magnets having closely spaced poles. The magnets are arranged in a closed kidney-shaped path. Although the total area of the magnetron is fairly large, the magnetic field extends over a relatively small area. To achieve the required uniformity of deposition, the kidney-shaped magnetron is rotated about the center of the target.

More advanced integrated circuit technology has placed somewhat different and more difficult requirements upon sputtering, and emphasis in sputtering has shifted from depositing horizontal interconnects to depositing vertical vias. The high complexity of advanced integrated circuits has been achieved in large part by decreasing minimum feature size and spacing between features. The resulting complex wiring has been accomplished by interconnecting multiple wiring levels by vias extending through an intervening dielectric layer. As schematically illustrated in FIG. 1, a lower dielectric layer 10, typically formed of silicon dioxide or related silicate glasses, includes a conductive feature 12 at its surface. An upper dielectric layer 14 is deposited over it. A via hole 16 is etched through the upper dielectric layer 14 overlying the conductive feature. The width of the via hole 16 is being pushed to 0.18 µm and below. Minimum feature sizes of 0.10 µm and even 0.07 µm are being developed. However, the thickness of the interlayer dielectric layer 14 is constrained to be a minimum of 0.7 to 1.0 µm to minimize cross talk and prevent dielectric discharge. The result is that the via holes 16 may have aspect ratios of 5:1 and greater. Sputtering is fundamentally a generally isotropic ballistic process ill suited to reaching into high aspect-ratio holes. If sputtering is used to fill the hole 16 with metal, the sputtering is likely to preferentially coat the upper corners of the hole 16 and to close it before the bottom is filled.

Furthermore, with such small feature sizes, diffusion between the metal and dielectric portions must be minimized. Accordingly, a standard practice has developed to precoat the via hole 16 as well as the planar top of the upper dielectric layer 14 with a thin barrier layer 20. A typical barrier material for aluminum metallization is Ti/TiN and that for copper metallization is Ta/TaN although other barrier materials and combinations have been proposed. To achieve its purpose, the barrier layer 20 should significantly and fairly uniformly coat the sides and probably also the bottom of the via hole. Again, sputtering is not inherently adapted for sidewall coverage.

Much work has been recently expended in developing the technology for copper metallization. Copper offers advantages of lower conductivity and reduced electromigration. Further, copper can easily be deposited even into high aspect-ratio holes by electrochemical plating (ECP). However, electrochemically plated copper requires that a copper seed layer 30, as illustrated in FIG. 2, be coated onto the top of the dielectric 14 and the sidewalls and bottom of the via hole 16 before a thick copper layer 32 is deposited by ECP. The copper seed layer 30 requires good bottom and sidewall coverage. Copper sputtering is preferred even under these difficult conditions.

The thick ECP copper layer 32 acts as both the via and the horizontal interconnects, typically in a process called dual damascene in which a trench is formed in the upper part of the dielectric layer 14 interconnecting multiple vias in the bottom part of the dielectric layer 14. The portion of the thick ECP copper layer 32 extending above the trench and the top of the dielectric layer is removed by chemical mechanical polishing (CMP). As a result, sputtering is being used less for depositing thick conductive layers and more for depositing thin layers in unfavorable geometries, in what are called barrier applications.

Both the barrier layer 20 and copper seed layer 30, when deposited by sputtering, tend to suffer the same type of non-uniform deposition typified by a sputtered layer 36 in the cross-sectional view of FIG. 3. A blanket portion 38 on the top of the dielectric layer 14 is relatively thick compared to a sidewall portion 40 and a bottom portion 42. The sidewall portion is high-aspect ratio holes 16 typically exhibits the lowest coverage relative to the blanket portion 38 and further often suffers from a minimum thickness 44, which needs to be maintained above a critical level to provide an electroplating current path to the bottom of the hole 16. Furthermore, an overhang portion 46 tends to form at the top of the hole 16 with a reduced entrance aperture 48. Although electroplating is generally effective at filling copper into a high aspect-ratio hole 16, it tends to be nearly conformal so that the entrance aperture 48 may close prior to completing the filling of the bottom of the hole 16. The resulting void in the copper severely affects the performance and reliability of the resulting device. An overly thin sidewall area 44 also results in a void included in the copper.

It has been recognized that effective sputtering of the barrier and copper seed layers can be accomplished by assuring a high fraction of ionized sputter metal atoms, whether of the barrier metal or of the copper, and by RF biasing the pedestal electrode supporting the wafer. The RF bias creates a negative self-bias adjacent to the plasma and accelerates the metal ions toward the wafer. The high forward velocity promotes the penetration of the metal ions deep into the high aspect-ratio holes.

A high density plasma of the sputter working gas increases the metal ionization fraction. Some suggestions have been made to achieve the high density plasma by inductively coupling additional RF power into the chamber. However, inductively coupled reactors tend to require high argon pressures and result in a high-temperature operation with possible damage from the energetic argon ions being accelerated to the wafer. The metal ionization fraction can also be increased by increasing the DC target power. However, for the 300 mm wafer technology being developed and even for 200 mm wafers, this approach causes the required power supplies to become prohibitively expensive, and controlling the target temperature becomes difficult.

Another and preferred approach, sometimes called self-ionized plasma (SIP) sputtering, described by Fu in U.S. Pat. No. 6,183,614, incorporated herein by reference in its entirety, is particularly useful for barrier sputtering in which only very thin layers are deposited, for example, 10 nm or less. SIP sputtering may be implemented with conventional planar targets in generally conventional and inexpensive magnetron sputter reactor chambers. In contrast, inductively coupled reactors require inductive coils in an expensive new design, and hollow cathode or vaulted target reactors expensive complexly shaped targets. SIP sputtering is based upon a small but strong magnetron which concentrates the high-density plasma region over a relatively small area of the target. As a result, somewhat modest power supplies of about 20 to 40 kW can be used to create a very high effective power density in the portion of the target underlying the magnetron. The high density plasma creates a high ionization fraction of the metal ions, estimated to be about 20% or greater. The metal ions are attracted to the wafer by RF biasing of the pedestal electrode to promote the coating the sides of deep holes.

Furthermore, the metal ion density is so high that some of the metal ions are attracted back to the target to resputter the target, hence the term self-ionized plasma. As a result, once the plasma has been ignited, the argon pressure in the chamber can be reduced, thus reducing the probability of scattering of the metal ions on their way to the wafer. A collision of a metal ion and argon would likely neutralize the metal atom. In the case of copper sputtering, under the right circumstances, the argon can be removed completely in a process called self-sustained sputtering (SSS).

SIP sputtering also benefits from an unbalanced magnetron including an inner pole of one vertical magnetic polarity surrounded by an outer pole of the opposed polarity, the total magnetic strength of the outer pole, that is, the magnetic flux integrated over the area of the outer pole, is substantially greater than that of the inner pole, for example, by at least a factor of 1.5 and preferably 2. The closed shape of the magnetron lessens electron loss in the high density plasma adjacent the target. The unbalanced magnetic field results in magnetic field lines projecting far from the stronger outer pole towards wafer. The projecting field lines both support a more extensive plasma and guide the metal ions towards the wafer.

Reasonable levels of sputtering uniformity are achieved in SIP sputtering by rotating the small magnetron about the center of the target and by shaping the magnetron to favor the outer portions of the target. Preferably, the outer pole of the unbalanced magnetron has a generally triangular shape with a triangular inner aperture in which is disposed the inner pole. Apex angles for the most acute corner are typically around 20 to 35°. The acute apex of the triangular pole overlies or is close to the center of rotation. The base of the triangular pole is close to the outer periphery and may be curved to follow the target circumference.

Although the rotating triangular magnetron provides reasonably adequate uniformity, uniformity for thin barrier layers in high-aspect ratio holes is a complex requirement, as has been partially discussed with reference to FIG. 3. Sidewall coverage needs to be relatively high, and it needs to be uniform across the large wafer. Furthermore, the sidewall coverage on one sidewall should not differ significantly from sidewall coverage on the opposed sidewall. The projecting magnetic field from the unbalanced triangular magnetron is very non-uniform in the radial direction, and its non-uniformity cannot be compensated by only circumferential scanning. The triangular design by itself is constrained for improving the many factors of uniformity and deep hole coating. Various types of auxiliary magnets have been proposed to compensate the inherent non-uniform magnetic field in a triangular magnetron, but these designs suffer their own deficiencies. Even a circular magnetron produces a magnetic field varying across its radius and its extensions.

Another problem with circumferentially scanned magnetrons is the typically non-uniform erosion in the radial direction. This problem arises even when the magnetron has a rather large size, such as the kidney-shaped magnetron. A typical erosion pattern 52 below an initial planar target surface 54 for a triangular SIP magnetron is illustrated in FIG. 4 for a magnetron having a target layer of the sputtering material bonded along an interface 56 to a backing plate of a different material. Distinctive annular trough-shaped erosion paths develop. It is difficult to achieve high utilization of the target center with only circumferential scanning of the small magnetron favored for SIP sputtering. Although the non-uniform erosion is reduced with the use of large kidney-shaped magnetron, it still occurs to a significant degree. The lifetime of the target is determined by the first exposure of the backing plate. Further sputtering would contaminate the wafer with the non-desired material of the backing plate, and the target must be discarded or at least refurbished with a new target layer. However, overall target utilization is poor, about 50% in the illustrated example. When an integral target is used without a distinct backing plate, as is typical for aluminum sputtering, the considerations are somewhat different, but poor target utilization resulting from erosion tracks is still a problem. It is greatly desired to achieve more uniform sputtering to avoid excessive expense in replacing targets.

A problem arises with magnetron sputtering being used for a variety of applications with differing requirements on the shape and intensity of the magnetic field. While satisfactory sputtering reactors have been designed for most of these applications, often the reactors and their magnetrons have substantially different designs. The increasing number of different types of reactors and magnetrons imposes economic and inventory penalties in designing, distributing, and maintaining so many different types of reactors. It is thus desired to obtain universal sputter reactor and magnetron designs in which small changes in the design or changed operational parameters allows the same design to be used in disparate applications.

Various suggestions have been made to scan a magnetron in both circumferential and radial directions about a circular target, typically in an epicyclic pattern of a primary rotation about the target center and a secondary rotation about the end of the arm of the primary rotation. See for example, U.S. Pat. No. 4,714,536 to Freeman et al. and U.S. Pat. No.

5,126,029 to Tomer et al. The Freeman design seems more practical, but it suffers from an inability to rotate the magnetron over the target center, and it is prone to excessive vibration. The Tomer design allows for center scanning, but its stationary internally toothed circumferential gear is unwieldy. The Tomer design is directed to smoothing non-uniform erosion tracks produced by a larger magnetron.

SUMMARY OF THE INVENTION

A planetary magnetron may be used in a plasma sputter reactor for increased uniformity of sputtering, more complete target utilization, and increased plasma density.

A planetary mechanism causes the magnetron, preferably including a magnet assembly much smaller than the target, to execute planetary motion in which the magnet assembly both rotates about the center of the target in an orbital motion and further rotates in a planetary rotation about an axis also rotating about the target center. The mechanism preferably allows the magnet assembly to scan over the center of the target. The motion is preferably retrograde planetary motion in which the planetary rotation is opposite to the orbital rotation.

Retrograde planetary motion with the rotation ratio between the planetary and orbital rotations being near unity allows the magnetron velocity to be much faster at the center of the target than at the target periphery. Rotation ratios of 1.03 to 6 as measured by gear ratios or other engagement ratios are preferred but integral values should be avoided. Rotation ratios from about 1.2 to about 1.66 and from about 2.5 to 4.97 provide a significantly larger velocity at the target periphery than the target center, thereby producing more uniform sputtering of the target.

The planetary mechanism may include a geared mechanism including an inner gear arranged around the central axis of the target, a rotary drive shaft extending along the axis and rotating a drive plate, an idler gear supported on the drive plate and engaged with the inner gear, and a follower gear supported on the drive plate and engaged with the idler gear. A bottom plate positioned between the drive plate and the target is fixed to the shaft of the follower gear and rotates with it. A magnet assembly depends from one end of the bottom plate adjacent the back of the target and executes the retrograde planetary motion. Other features of the geared planetary mechanism may be applied to the belted planetary mechanism.

The inner gear may be fixed, in which case the gear ratio between the follower and fixed inner gear determines the rotation ratio between the follower gear and attached magnet assembly and the drive plate, that is, the ratio of planetary and orbital rotation rates. The ratio of the magnet assembly velocities at the target center and at the target periphery is determined by the gear ratio and additional by the ratio of rotation arms from the target center to the follower gear and from the follower gear to the magnet assembly.

Preferably, a first counterweight is supported on the end of drive plate opposite the follower gear, and a second counterweight is supported on the end of the bottom plate opposite the magnet assembly.

The inner gear may alternatively be rotated by a second rotary shaft.

The geared planetary mechanism may alternatively be implemented with a fixed external gear with inwardly projecting teeth engaging the follower gear rotated on the drive plate. No idler gear is required.

The planetary mechanism may instead include a belted mechanism including a capstan around the central axis, a rotary drive shaft extending along the axis and rotating a drive plate, a follower pulley support on the drive plate, and a belt wrapped around the capstan and follower pulley. The bottom plate and attached magnetron located beneath the drive plate are fixed to the shaft of the follower pulley and rotates with it. The capstan may be either fixed or rotated by a separate drive shaft.

The small magnet assembly, preferably having no more than 10% of the area of the target being scanned, may be an unbalanced magnetron having a weak inner pole of one polarity along the central target axis surrounded by a stronger outer pole of the opposed polarity. The ratio of integrated magnetic fluxes of the two poles is preferably 15 least 1.5. For deep hole filling, the magnetic flux ratio is advantageously further increased to 3 or 5 or even more. Extra magnetic flux may be provided by multiple rows of close packed cylindrical magnets or by a magnetic annulus, perhaps formed of multiple arc-shaped segments. The small magnet assembly may alternatively be a balanced magnetron having equal intensity inner and outer opposed band-shaped poles separated by a gap. In either case, the magnet assembly may be circularly symmetric or may have another shape.

DETAILED DESCRIPTION OF THE PREFERRED EMBODIMENTS

One principal embodiment of the invention relies upon a planetary mechanism, for instance, one using a planetary gear system, to allow a small circularly symmetric magnetron to fully cover the sputtering target. The planetary mechanism produces a planetary motion similar to that of a planet orbiting the sun while it is simultaneously executing planetary rotation about its own polar axis. For use with a magnetron, the planetary axis is parallel to but displaced from the orbital axis and the orbit is circular about the orbital axis. The magnet assembly of the magnetron is displaced from and rotates about the planetary axis while the planetary axis orbits or rotates about the orbital axis, thereby producing a complex trajectory for the magnetron. In retrograde planetary motion, the direction of planetary rotation is the reverse to the direction of orbital rotation.

Figure 5:
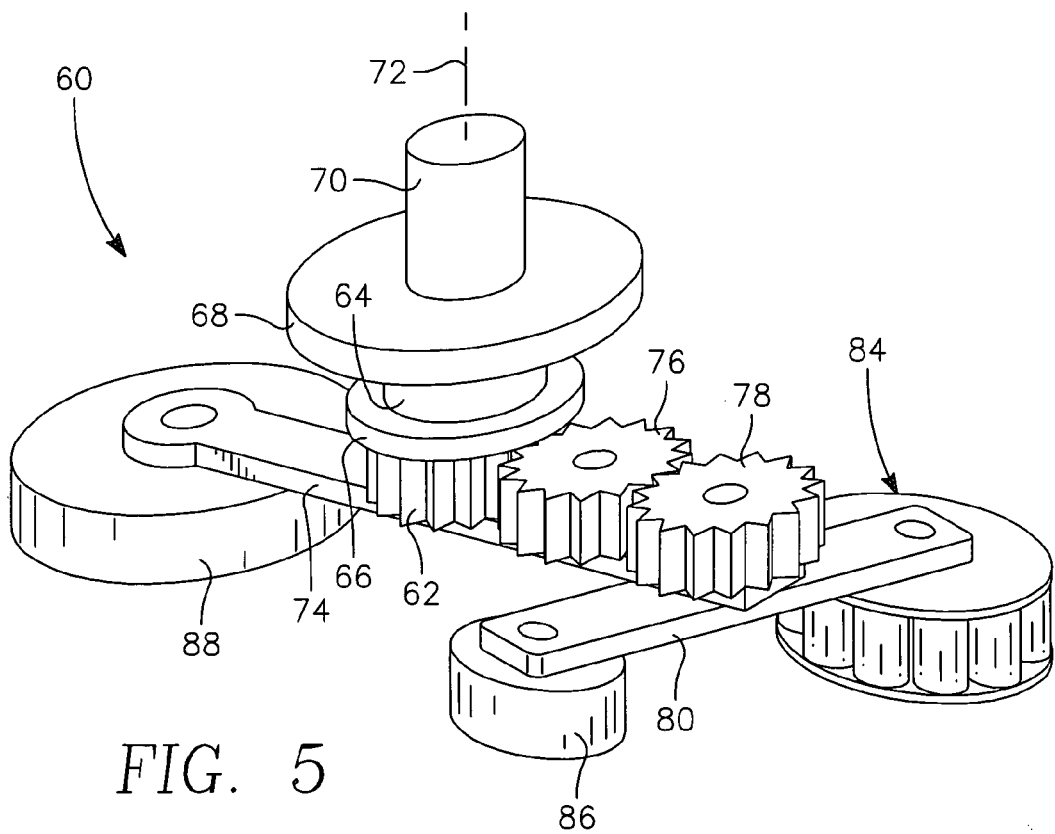
FIG. 5 is an orthographic view of a geared planetary magnetron.

In one geared embodiment illustrated in the orthographic view of FIG. 5, a magnetron assembly 60 includes a fixed gear 62 fixed to a stationary circular mount 64 attached to an unillustrated top wall of the magnetron housing through two mounting plates 66, 68. A motor driven shaft 70 is coaxial along a central axis 72 with the fixed gear 62 and supports the fixed gear 62 beneath a main carrier or drive plate 74 that thereby rotates about the center 72 of the fixed gear 62 and acts as the planetary driver. A center or idler gear 76 is freely and rotatably supported on the drive plate 74, but its teeth are engaged with the teeth of the fixed gear 62. A rotating or follower gear 78 is similarly freely and rotatably supported on the drive plate 74, and its teeth are engaged with the teeth of the idler gear 76. As a result, as illustrated also in the top plan view of FIG. 6, as the motor driven shaft 70 rotates and drives the drive plate 74, the idler gear 76 and the follower gear 78 gear rotate with it about the central axis 72, for example in the counter-clockwise direction, and the idler gear 76 is rotating in the counter-clockwise direction about its own axis. Simultaneously, the follower gear 78 is rotating about its own axis in the opposed (clockwise) direction.

Figure 6:
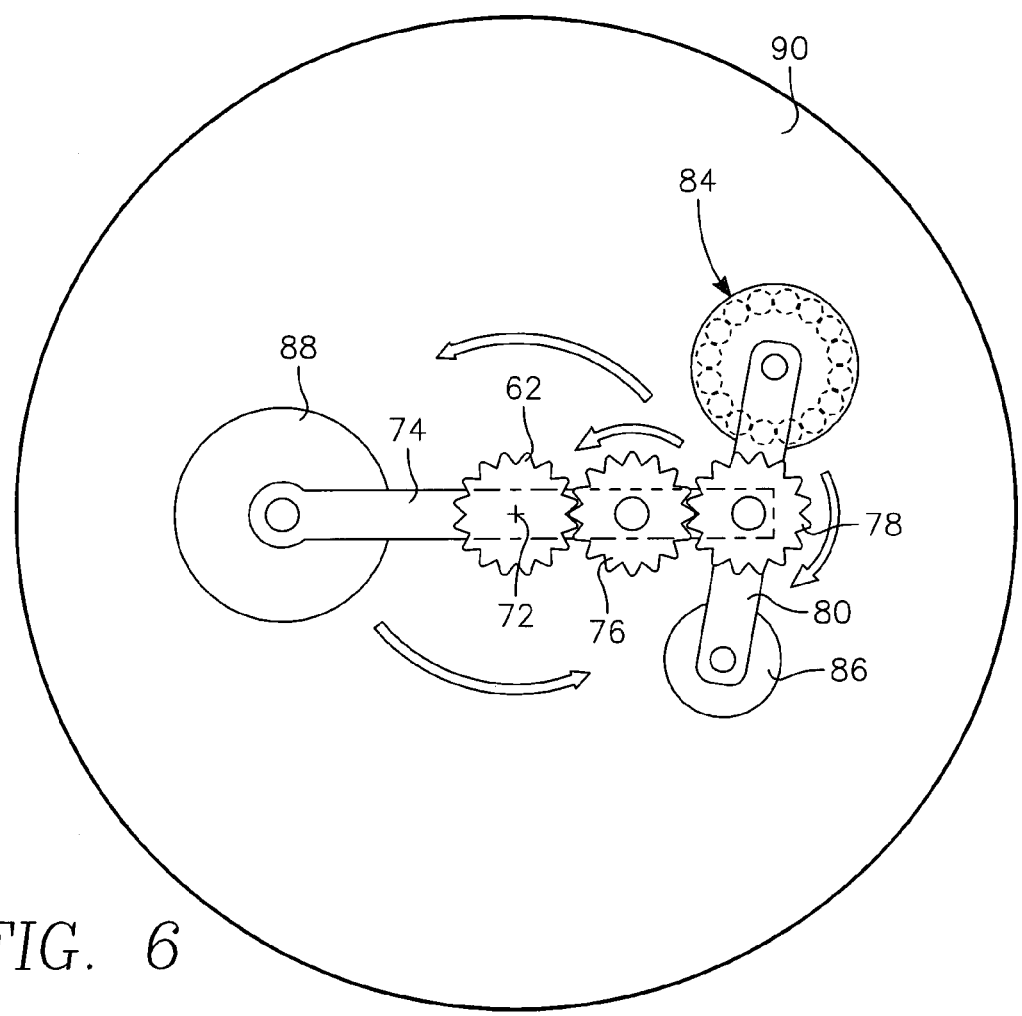
FIG. 6 is a top plan view of the planetary magnetron of FIG. 5.

The follower gear 78 is fixed to and supports a bottom plate 80 located beneath the drive plate 74 so that the bottom-plate bottom plate 80 thus rotates with the follower gear 78, and it may rotated through the center axis 72. A magnet assembly 84 is supported beneath one end of the bottom plate 80, and a magnet counterweight 86 is supported beneath the other end of the bottom plate 80. Another counterweight 88 is attached to the other end of the drive plate 74. The counterweights 86, 88 are best implemented as integral bodies of circularly symmetric shaped. The balanced masses and moments of inertia should be within 90% and preferably 95% of each. This gear arrangement causes the magnet assembly 84 to execute an epicyclic motion with a primary arm of rotation of length $A_1$ extending along the drive plate 74 and a secondary arm of rotation of length $A_2$ extending through the bottom plate 80. With reference to FIG. 6, the planetary mechanism sweeps the relatively small magnet assembly 84 over substantially the entire usable surface of a much larger target 90, which is also circularly symmetric about the center axis 72.

The dual counterbalancing minimizes magnetron vibration in its complex motion. Preferably, the magnet assembly 84 and its counterbalance 86 have the same mass and have equal rotation arms about the center of the follower gear 78. Similarly, the primary counterbalance 88 preferably has the same mass and the same rotation arm about the center axis 72 as the total assembly it balances.

The planetary motion, as best illustrated in the top plan view of FIG. 6, includes the counter-clockwise rotation of the drive plate 74 about the central axis 72. The idler and follower gears 76, 78 carried by the drive plate 74 also rotate with it about the central axis 72 but additionally rotate about their own axes, the idler gear 76 additionally rotating counter-clockwise and the follower gear 80 additionally rotating clockwise. The magnet assembly 84 carried on the bottom plate 80 fixed to the follower gear 78 also rotates in a counter-clockwise orbital rotation about the central axis 72 and additionally performs a clockwise planetary rotation about the axis of the follower gear 78. The two opposed rotation directions of the magnet assembly is called a retrograde planetary motion. The rotation rate of the follower gear 78 is directly related to the rotation rate of the driven shaft 70 according to the gear ratio $R_G$ between the fixed and follower gears 62, 78. For the simple illustrated geared planetary system, the gear ratio $R_G$ is equal to the ratio of the diameters of the follower and fixed gears 78, 72

$$R_G = \frac{D_{FIXED}}{D_{FOLLOWER}},$$

although the gear ratio is more fundamentally determined by the ratio of the number of gear teeth. It is well known how to calculate gear ratios for more complicated gear arrangments.

The planetary gear system may be varied to achieve different operational results. However, it has been found that superior results can be obtained in one case with a circularly symmetric magnetron when the two arms of the magnetron have approximately equal lengths, for example a ratio of between 0.66 and 1.5 where the planetary motion is retrograde, and where the gear ratio between the follower and fixed gears is relatively large but non-integral. The nearly equal arm lengths, each equal to about half the target radius, allow the circular magnetron to sweep from the periphery of the target 90 to its center and over the center 72 thus allowing full target coverage. Gear ratios of greater than two produce a tight path 92 illustrated in FIG. 7 in which the diamonds mark equal time intervals. This path 92 is calculated for a gear ratio of 1:3.15, a planetary arm that is 0.8 that of the primary arm, and a reverse rotation of the follower gear, that is, retrograde planetary motion.

Figures 7, 8:
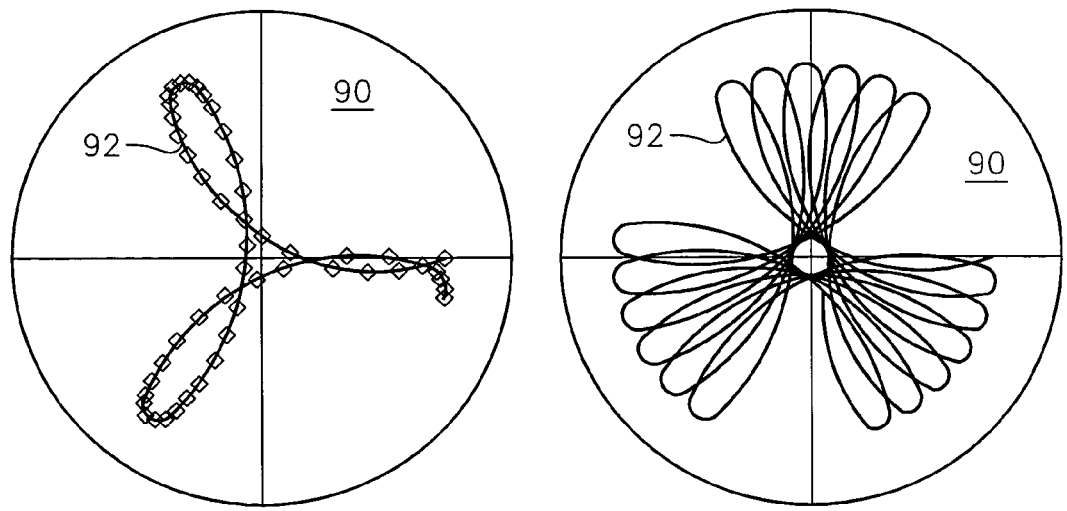
FIGS. 7 and 8 are plots of the paths of the magnet assembly under planetary motion.

The path 92 is assumed to be the center of a moderately sized magnet assembly 84 so that magnetic portions of the magnet assembly passes over the target center 72. The complete counterbalancing of the magnetron assembly of FIGS. 5 and 6 allows the elimination of a center support post, which in the Freeman design prevents over scanning of the target center. When the follower gear is operated with reverse rotation, the velocity of the magnetron near the center 72 is about three times that at the target periphery while in forward rotation the velocity near the center is less than that at the periphery. The large velocity difference produces a much more uniform erosion of the target and hence uniform sputtering deposition across the target radius. Generally, the number of lobes, here about three for a single rotation of the drive plate, is approximately equal to the gear ratio for either forward or retrograde planetary motion. However, if the gear ratio is not an integral value, the pattern does not replicate over the relatively short periods illustrated. Instead, the lobes precess to more uniformly cover the target 90. The path 92 is illustrated in FIG. 7 for a single rotation of the drive shaft, which for a shaft rotation of 60 rpm represents about 1 s. The path 90 illustrated in FIG. 8 extends over 6 s. It is seen that about a 10 s scan will provide full coverage of the target and represents a full coverage period. Although ideally the sputtering time should be a full coverage period, 10 s in the illustrated case, or an integral multiple thereof to avoid non-uniform overlap between successive complete scans, in fact, the sputtering pattern for retrograde planetary motion with a nearly integral gear ratio has a near multi-fold azimuthal symmetry so that for a reasonably large throw length, the azimuthal non-uniformity is typically not a significant problem. A larger difference from an integral gear ratio will shorten the time over which the pattern repeats but also decrease the velocity difference. From equations developed below, it will become clear that advantageous velocity differences may be obtained in the range to 2.5 to 5, with integral values being disfavored because of a lack of precession. Forward planetary rotation will produce nearly the same locus but the velocity at the center will be less than that at the periphery.

However, in another interesting regime, the second arm has a length of only about half of that of the primary arm and the retrograde gear ratio is only slightly greater or less than one, for example, in the range of 1.03 to 1.66. The velocity ratio is not so large in this case and the center of the magnet assembly does not sweep over the target center 72. However, the magnet assembly is large enough so part of its magnetic portions over the central area, thus reducing the effective dwell time near the center.

The planetary motion is easily calculated as a complex position r in a complex plane having its origin at the target center. The position x of the object executing planetary motion is given by $$x = A_1 e^{i\omega_1 t} + A_2 e^{i\omega_2 t},$$

where with little loss of generality $A_1$ and $A_2$ are real positive numbers representing the lengths of the primary and secondary moment arms, $\omega_1$ is the rotation rate of the drive plate expressed in radians per second, and 107 $_2$ is the rotation rate of the follower gear with reference to fixed coordinates. For retrograde planetary motion, the two rotation rates are of opposite sign. A somewhat unconventional notation will be used to facilitate the derivation for the desirable large gear ratios producing retrograde planetary motion. For planetary motion expressible in a gear ratio $R_G$, the two rotation rates are related by $$\omega_2 = (1 + R_G)\omega_1.$$

For retrograde planetary motion, the gear ratio $R_G$ in this convention is positive while it is negative for forward planetary motion. Let the ratio of the arm lengths be represented by $$R_A = \frac{A_2}{A_1}$$

so that the position may be expressed as $$x = A_1 e^{i\omega_1 t} \{1 + R_A e^{-iR_G \omega_1 t}\}$$

The complex velocity v is the time derivative of the position x, which is given by $$v = \dot{x} = i\omega_1 A_1 e^{i\omega_1 t} \{1 - e^{iR_G \omega_1 t} R_A (R_G - 1)\}$$

To return to real values, the square of the magnitude of the velocity, that is, the square of the speed is given by $$|v|^2 = vv^*$$
$$= \omega_1^2 A_1^2 \{1 + R_A^2 (R_G - 1)^2 - R_A (R_G - 1)(e^{iR_G \omega_1 t} + e^{-iR_G \omega_1 t})\}$$
$$= \omega_1^2 A_1^2 \{1 + R_A^2 (R_G - 1)^2 - 2R_A (R_G - 1)\cos R_G \omega_1 t\}$$

Assuming that $R_G$ is greater than $(1+1/R_A)$, the maximum velocity occurs when the cosine term is a negative one and the minimum when it is a positive one so that the ratio of the squares of the maximum to the minimum velocities is given by $$\left|\frac{v_{max}}{v_{min}}\right|^2 = \frac{1 + R_A^2(R_G-1)^2 + 2R_A(R_G-1)}{1 + R_A^2(R_G-1)^2 - 2R_A(R_G-1)}$$
$$= \left[\frac{1 + R_A(R_G-1)}{1 - R_A(R_G-1)}\right]^2.$$

The last equation is valid for gear ratios of any value although the order of the ratio may be reversed. However, for the important case of $R_G$ greater than 1, $$\frac{v_{max}}{v_{min}} = \frac{R_A(R_G-1)+1}{R_A(R_G-1)-1}.$$

For $R_A=1$ and $R_G=3$, which are approximately the values for the trajectories of FIGS. 7 and 8, the velocity ratio is 3. For another regime of $1<R_G<(1+1/R_A)$, the velocity ratio is given by $$\frac{v_{max}}{v_{min}} = \frac{1 + R_A(R_G-1)}{1 - R_A(R_G-1)}.$$

Examination of these equations for a unity arm ratio shows that advantageous rotation ratios are obtained for ranges of $R_G$ between 1.2 and 1.66 and between 2.5 and 5 or even 6. However, integral gear values should be avoided since the lobed pattern does not then precess. Adequate precession is typically obtained if gear ratios $R_G$ within 0.03 of integers are avoided. The singularity at $R_G=(1+1/R_A)$ is caused by an instantaneous zero velocity near the target periphery.

Figure 9:
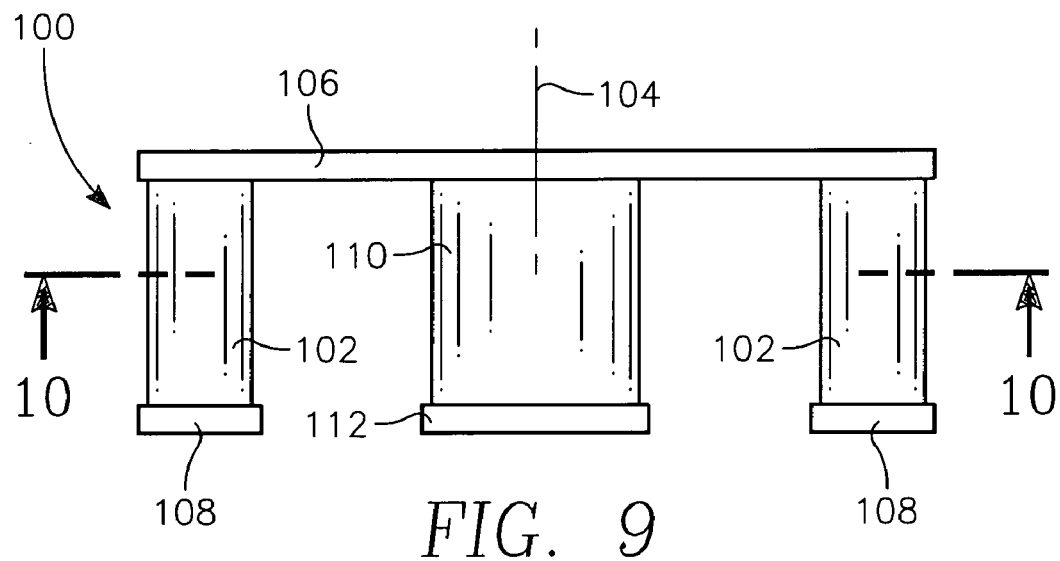
FIG. 9 is a cross-sectional view of an unbalanced circularly symmetric magnet assembly.
Figure 10:
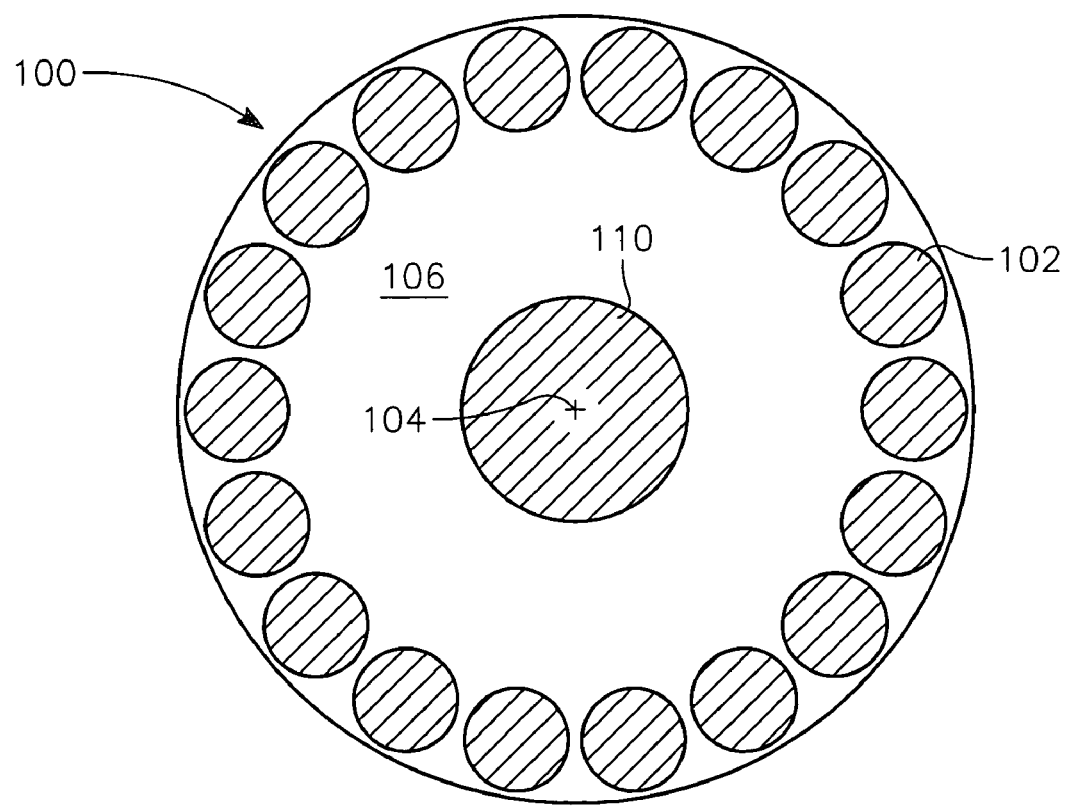
FIG. 10 is a bottom view of the magnet assembly of FIG. 9 taken along view line 10—10.

The magnet assembly 84 is preferably circularly symmetric, one embodiment 100 of which is illustrated in cross-sectional views from the side in FIG. 9 and from the bottom in FIG. 10. It has a total area of preferably no more than 10% of the area of the target being scanned, even more preferably less than 5%. A magnet assembly with an area ratio of less than 2% has demonstrated reasonably good uniformity in a planetary magnetron.

A large number of cylindrical outer magnets 102 of a first magnetic polarity along the cylindrical axes are arranged in a circular pattern about a magnetic center axis 104. They are supported by a circular magnetic yoke 106, for example, of a magnetically soft stainless steel, which in turn is fixed to the bottom of the planetary bottom plate 80. The bottom, free ends of the outer magnets 102 are covered and magnetically coupled by an annular magnetic pole piece 108. A cylindrical inner magnet 110 of the opposed magnetic polarity is positioned in the center of the circular array of outer magnets 102 and is supported by the magnetic yoke 106, which magnetically couples the inner magnet 110 to the outer magnets 102. The bottom end of the inner magnet 110 is preferably covered by a circular pole piece 112. The magnets are typically encapsulated in stainless steel packages having end tips which are captured by holes in the magnetic yoke 106 and the pole pieces 108, 112. Unillustrated screws fix the pole pieces 108, 112 to the yoke 106 with the magnets 102, 110 sandwiched between them. The total magnetic strength of the outer magnets 108 is greater than that of the inner magnet 110 by a factor of at least 1.5, resulting in the magnet assembly 100 being unbalanced. If the same magnetic material is used for all the magnets, the total strength, which is the magnetic flux integrated over surface area, is proportional to the total cross sectional area of the outer magnets 102 or inner magnet 110.

The width of the magnet assembly 84 should be considered in determining full target coverage. One condition for full coverage is that $$A_2 + R_M > A_1,$$

where $R_M$ is the radius of the outer magnetic parts of the magnet assembly 84 about the center 104, that is, the magnets 102, although a better but less quantifiable radius is that of the toroidal magnetic components to be described later.

Figure 11:
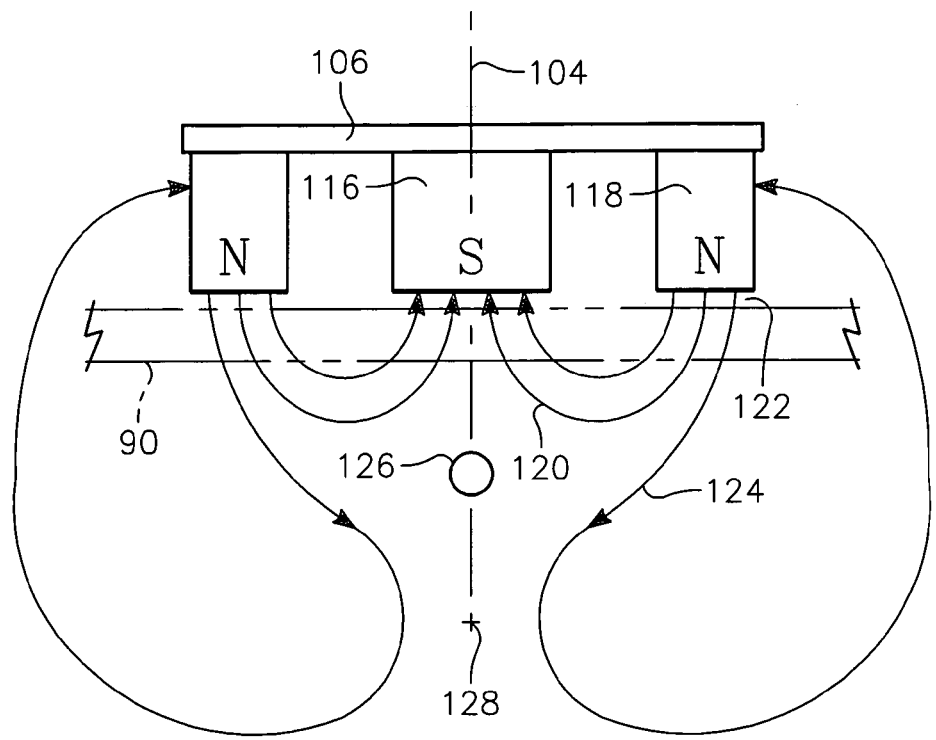
FIG. 11 is a schematic illustration of the magnetic field distribution produced by a unbalanced circular magnetron.

A circular unbalanced magnet assembly provides several advantages for uniform sputtering into high-aspect ratio holes. As schematically illustrated in FIG. 11, an unbalanced circular magnetron including an inner pole 116 of one magnetic polarity surrounded by a stronger outer pole 118 of the other polarity and both generally circular symmetric about the center axis 104 produces a magnetic field distribution also symmetric about the axis 104. The magnetic field distribution includes semi-toroidal components 120 following a smooth path from the outer pole 118 to the inner pole 116. The faces of the poles 116, 118 are placed closely to the back of the target 90 with a gap 122 of minimum size between them. As a result, some of the semi-toroidal components 120 extend generally in parallel to the front face of the target 90 The parallel magnetic field traps electrons and greatly increases the density of the plasma adjacent the target. The semi-toroidal components are symmetric about the magnetic center axis 104 and form a closed loop for trapping the plasma electrons, thus reducing electron loss. The dual-counterbalance design of the magnetron of FIGS. 5 and 6 reduces jitter and vibration and hence allows the gap 122 to be decreased in contrast to the Freeman design in which the planetary rotation is not counterbalanced.

The magnetic field distribution also includes components 124 projecting from the stronger outer pole 118 far from the target 90 towards the wafer being sputter coated. The projecting components 124 emanating from the stronger outer pole 118 curve towards the center line 104 of the magnet assembly as they approach the wafer before returning to the back of the outer pole 118 or the back yoke 106. The projecting components 124, which result from the magnetron unbalance, both extend the plasma and guide the ionized metal atoms to the wafer. In a circular magnet assembly, the projecting components 124 are also circularly symmetric and do not favor either the inner or outer portions of the wafer, particularly after the full planetary motion is considered. Furthermore, the circular geometry allows the unbalance of the magnets to be maximized, thus allowing an increase the projecting components without decreasing the semi-toroidal components 120 which increase the plasma density. Lastly, the unbalanced magnetron creates a null 126 as well as a local maximum 128 in the magnetic field distribution. The null 126 traps electrons to a very high density. When neutral sputtered metal atom pass through the highly ionized null 126, they tend to collide with the electrons and to become ionized, thus increasing the metal ionization fraction. The circular symmetry minimizes the separation of the null 126 from the target, thus increasing its ionizing effect.

Figure 12:
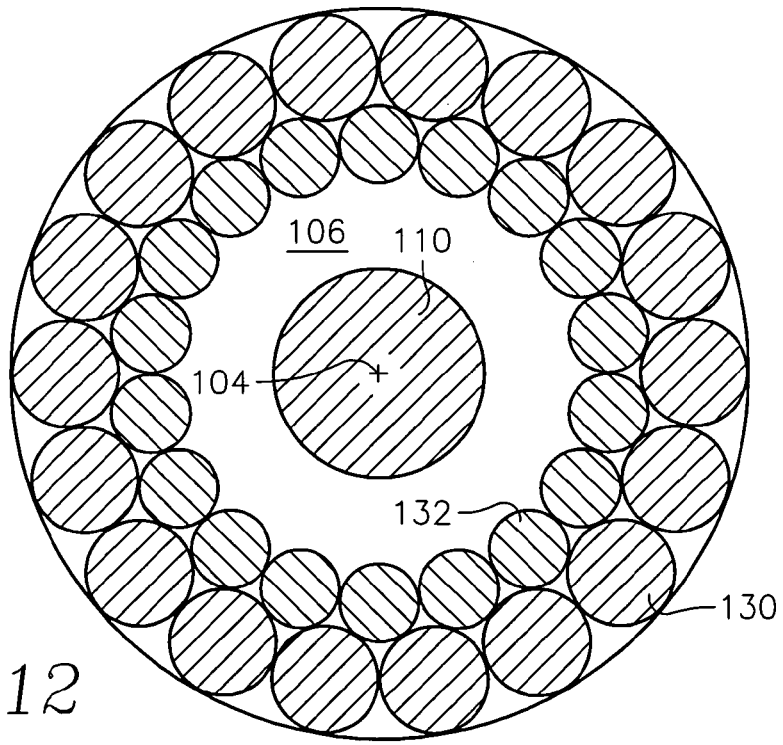
FIGS. 12 and 13 are cross-sectional bottom views of two alternative circularly symmetric magnet assemblies.
Figure 13:
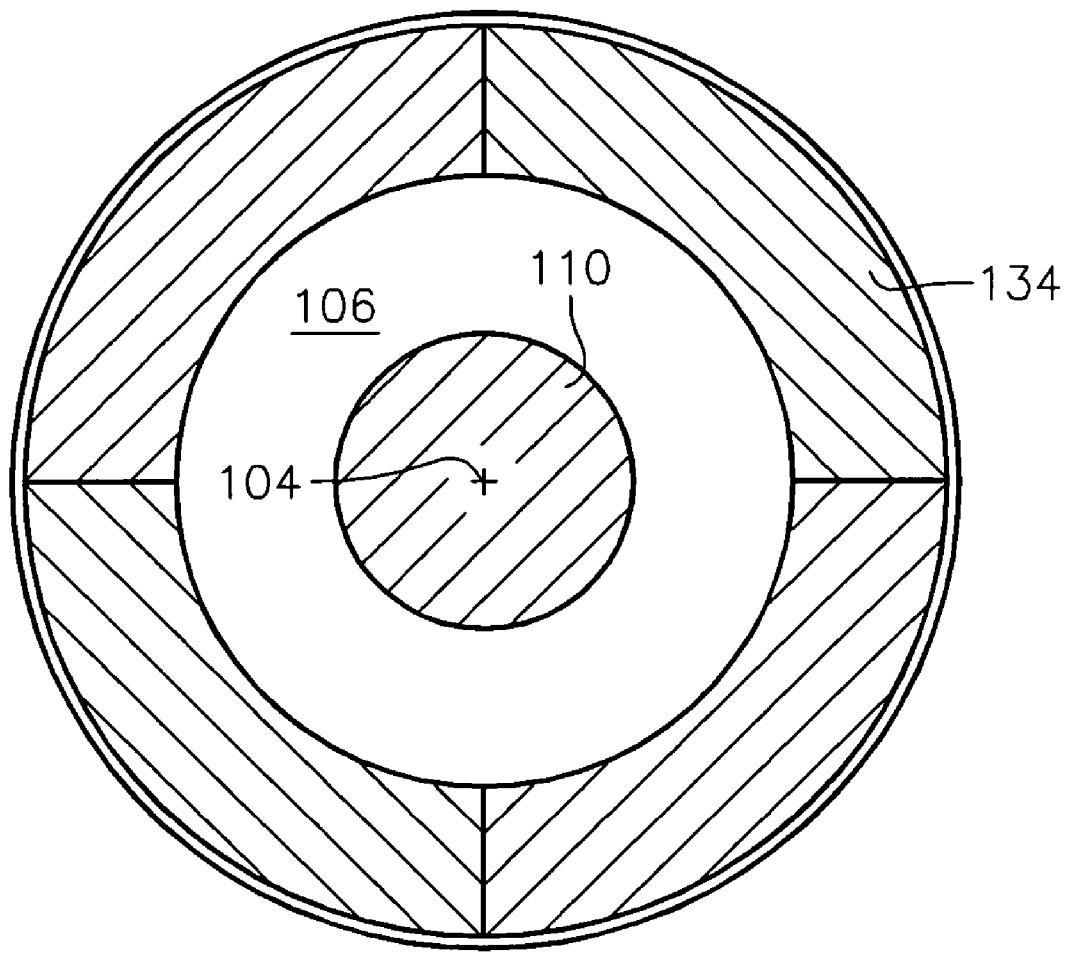

Several variants are available for the magnetron 100 of FIGS. 9 and 10. The cylindrical center magnet 76 may be replaced by multiple smaller magnets, preferably numbering three, four, or seven, the last being in a hexagonal close packed arrangement. For special effect, the cylindrical center magnet 76 may be replaced by a tubular inner magnet with an annular pole piece. The outer magnets 102 may be replaced, as illustrated in the sectional view of FIG. 12 generally corresponding to FIG. 10, by two rows of magnets 130, 132 covered by a single annular pole piece 108, preferably with the outer magnets 132 being of slightly larger size so that the multiple rows are close packed. Alternatively, as illustrated in the sectional view of FIG. 13, the outer magnets 102 are replaced by an annular band of arc-shaped magnets 134 magnetized in a single direction along the axis 104 and having a generally rectangular cross section along the azimuthal direction. Preferably, the magnets 134 number four or more to facilitate their fabrication. Either arrangement increases the magnetic density of the outer magnetic pole, thus allowing an increase in unbalance in the magnetron, thus increasing the projecting magnetic field, without sacrificing the important semi-toroidal component adjacent the face of the target. The increased projecting magnetic components greatly promote deep hole filling and other sputtering efficiencies. The ratio of the outer to inner magnetic intensities thus are advantageously increased to above 3 or even above 5.

Figure 14:
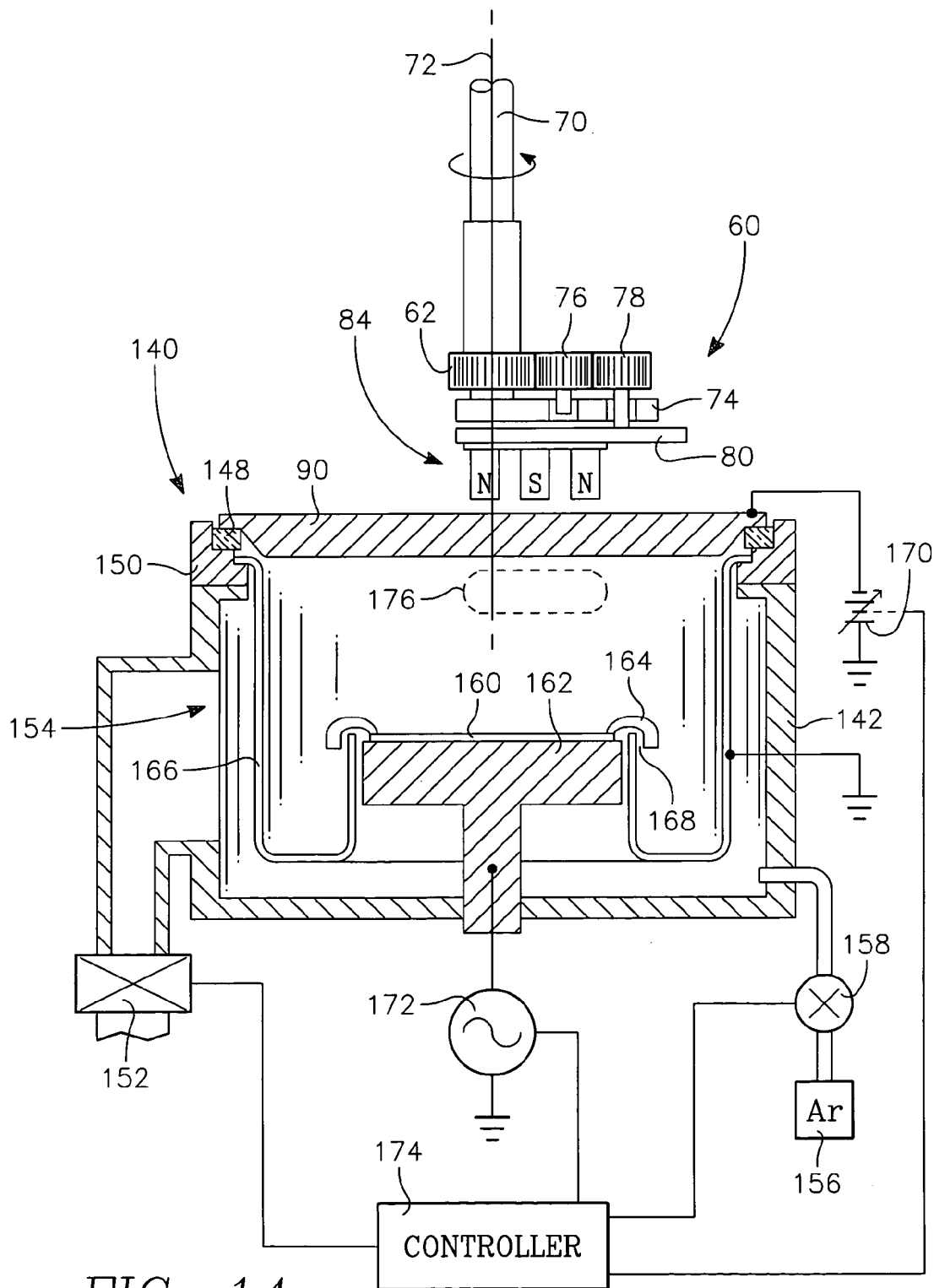
FIG. 14 is a sectioned side view of a sputter reactor incorporating the planetary magnetron of FIGS. 5 and 6.

The magnetron 60, schematically illustrated in FIG. 14 without the counterweights and fixed support structure, may be used in an otherwise fairly conventional plasma sputter reactor 140 having a chamber body 142 arranged around the central axis 72. The metallic target 90 is vacuum sealed through an annular isolator 148 to an adaptor 150, which is sealed to the chamber body 142 and allows easy adjustment of the spacing between the target and the wafer. A vacuum pump 152 pumps the interior of the chamber 142 through a pumping port 144. A gas source 156 supplies a sputter working gas, such as argon, into the chamber 142 through a mass flow controller 158. If reactive sputtering is desired, for example, of a metal nitride, a reactive gas, such as nitrogen, is also supplied.

A wafer 160 is supported on a pedestal electrode 162 in opposition to the target 90, and a wafer clamp ring 164 may be used to hold the wafer 160 to the pedestal 162 or to protect the pedestal periphery. A grounded shield 166 resting on the adapter 150 protects the chamber walls and sides of the pedestal from sputter deposition and also acts as an anode in the plasma discharge. The working gas enters the main processing area through a gap 168 between the clamp ring 164 and the shield 166. A DC power supply 170 negatively biases the target 90 with respect to the grounded shield 166 and causes the argon working gas to discharge into a plasma. The positively charged argon ions are attracted to the target 90 with sufficient energy to sputter the metal from the target 90, and the sputtered metal deposits on and coats the surface of the wafer 160. Preferably for deep hole filling, an RF power supply 172 is connected to the pedestal electrode 162 to create a negative self bias on the wafer 160, which is effective at accelerating positive metal ions toward the wafer 160 in perpendicular trajectories that more easily enter high-aspect holes. A controller 174 controls the vacuum pump 92, the argon mass flow controller 82, and the power supplies 170, 172 according to the desired sputtering conditions.

The magnetron 60 creates a magnetic field component parallel to the face of the target 90 underlying the transient position of the circular magnet assembly 84 and thereby creates a small region 166 of a high-density plasma producing a high sputtering rate in the adjacent portion of the target 90 and a high metal ionization fraction. The unbalanced magnet assembly 84 also creates magnetic field components which project from the target 90 towards the wafer 160 and guide the metal ions to the wafer 160. The circularly symmetric magnet assembly 84 creates a circularly symmetric magnetic field distribution for both the parallel and projecting components of the field.

The magnet assembly 84 performs a planetary motion about the central axis 72 coincident with the center of the target 90. The drive shaft 70 extending along and rotating about the central axis 72 rotationally drives the carrier or drive plate 74, which rotatably supports the idler gear 78 engaged with the fixed gear 62 (whose support structure is not shown) and the follower gear 78 engaged with the idler gear 76. The bottom plate 80 supporting the magnet assembly 84 on one side is rotated by the follower gear 78.

The magnet assembly 84 thus performs a planetary motion that may be designed to sweep over the center 72 of the target 90 as well the target periphery. The full coverage is obtained by cantilevering the two plates 74, 80 from the drive shaft 70. The two counterweights 86, 88 of FIG. 5 allow this eccentric and cantilevered motion without undue vibration.

Figure 15:
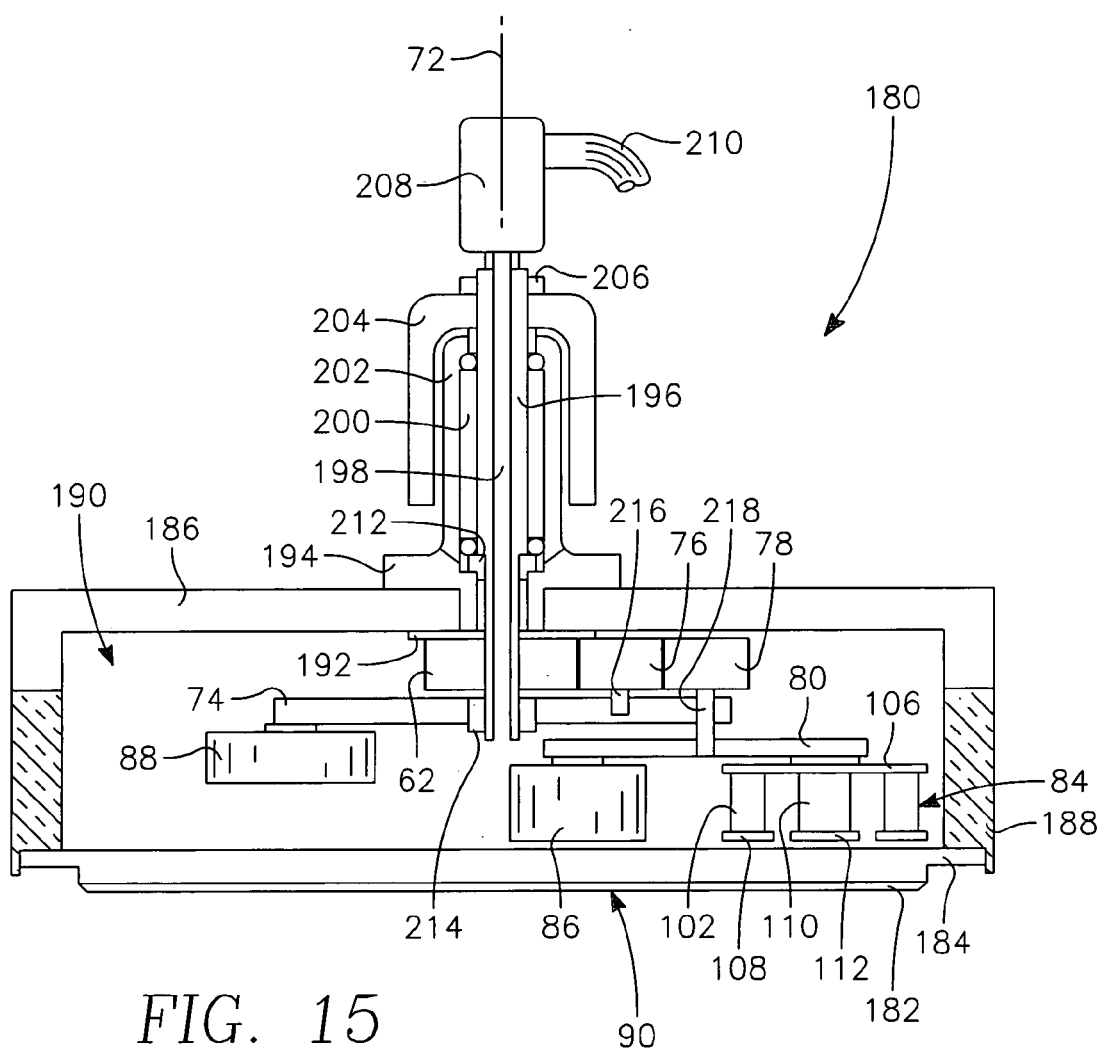
FIG. 15 is a sectioned side view of the magnetron assembly used in the sputter reactor of FIG. 14.

A more detailed cross-sectional view of a magnetron assembly 180 is illustrated in FIG. 15. The target 90 includes a target layer 182 of the material to be sputtered attached to a target backing plate 184. In DC magnetron sputtering, the target material is typically metallic so that it can be electrically biased. A top cover 186 is fixed to the target backing plate 184 through a tubular isolator 188 and surrounds and seals a cavity 190 in which a water-cooled magnetron rotates. The isolator 188 allows the target 90 to be electrically biased while the top cover 186 and magnetron elements attached to it remain grounded for reasons of safety. A bottom ring 192 and a mounting flange 194 are fixed to opposite sides of the top cover 186, and a rotatable drive shaft 196 with a central bore 198 passes through them. A ball-bearing sleeve 200 rotatably supports the drive shaft 196 inside a cup housing 202 fixed to the mounting flange 194. A drive bell 204 is fixed to the drive shaft 198 between retainer nuts 206 and is rotated by unillustrated gears and motor to rotate the drive shaft 196. A rotary union 208 is supportably held on the top of the drive shaft 196 to allow cooling water or other fluid to flow into the shaft bore 198 through a water hose 210 and thence into the cavity 190. An unillustrated water outlet penetrates the top cover 186 to allow the circulation of cooling water. A rotary retainer ring 212 between the drive shaft 198 and the mounting flange 194 seals the cooling water within the cavity 190.

Unillustrated screws attach the fixed gear 62 to the bottom ring 192 and hence to the top cover 186. A clamp ring 214 is clamped to the bottom of the drive shaft 198 and is fixed to the drive plate 74. The main counterweight 88 is supported on a first end of the drive plate 74. The idler gear 76 is fixed to an idler shaft 216 which is rotatably supported in the second end of the drive plate 74. Teeth engage the fixed and idler gears 62, 76. Similarly, the follower gear 78 is fixed to a follower shaft 218 rotatably supported farther out on the second end of the drive plate 74, and teeth engage the idler and follower gears 76, 78. The bottom plate 80 is fixed to the end of the follower shaft 218 below the drive plate 74 and rotates with the planetary motion of the follower gear 78.

The magnetron yoke 106 is fixed to the bottom of a first end of the bottom plate 80 so the magnet assembly 84 depends from the bottom plate 80 with its pole pieces 108, 112 in close adjacency to the target backing plate 184. The magnetron counterweight 88 depends from the other end of the bottom plate 80. The double counterbalancing allows planetary motion with a minimum of vibration, thus allowing the gap between the pole pieces 108, 112 and the target to be minimized, thus increasing the effective magnetic field adjacent the front face of the target layer 122. Both the magnet assembly 84 and its counterweight 86 lie under the drive plate 74 so that both of them can pass under the fixed gear 62 and through the axis 72 of its drive shaft 198.

Although the embodiment described above include an innermost gear 62 fixed with respect to the top cover 186 of FIG. 15, it is to be appreciated that an additional rotation of the innermost gear 62 about the center axis 72 causes it to rotate relative to the top cover 186 and to provide additional rotation with respect to the drive plate 74 with little impact upon the rest of the design. Although this embodiment complicates the mechanical design in requiring two coaxial rotations about the central axis 72 or a second offset drive shaft with a geared engagement with the innermost gear 62 as well as attendant rotary seals and rotary drives, the additional independent rotation provides additional flexibility of operational control without the need to change mechanical parts. For example, it may desirable to provide a reactor capable of depositing relatively thin barrier or seed layers during an integral number of full-coverage cycles discussed with respect to FIG. 8 under slightly varying conditions. A variable speed shaft supporting the innermost gear 62 allows the pattern of FIG. 8 with respect to a fixed target 90 to cycle an integral number of times for different sputtering periods. That is, a single magnetron assembly can be optimized for use with different barrier/liner applications. Further, the same magnetron assembly can be optimized for use for thicker blanket depositions requiring long deposition times, thus enabling a universal magnetron for disparate applications.

Figure 1:
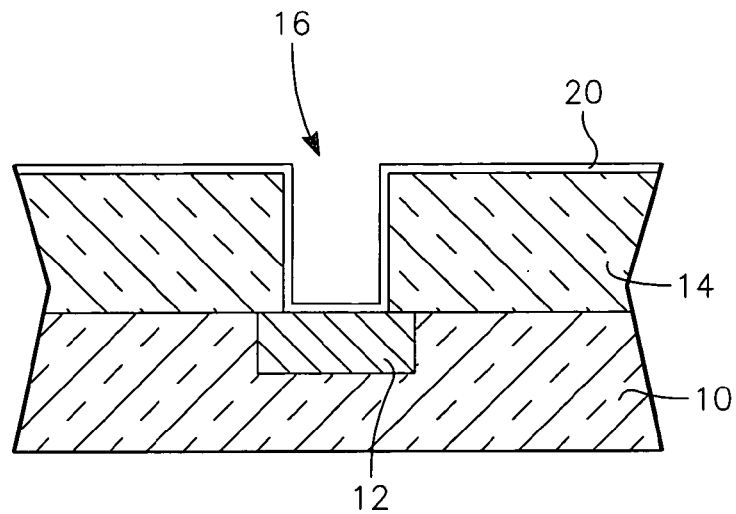
FIGS. 1 and 2 are cross sectional view of integrated circuit via structures to which the sputtering apparatus of the invention may be applied.
Figure 2:
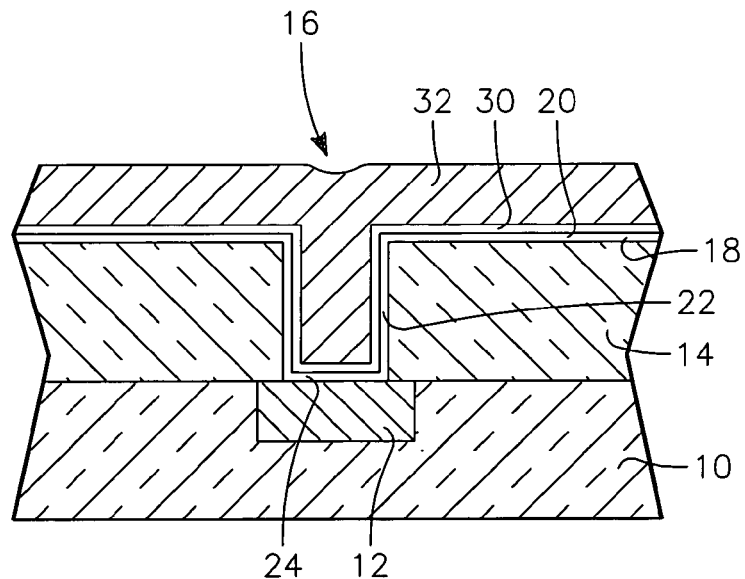
Figure 3:
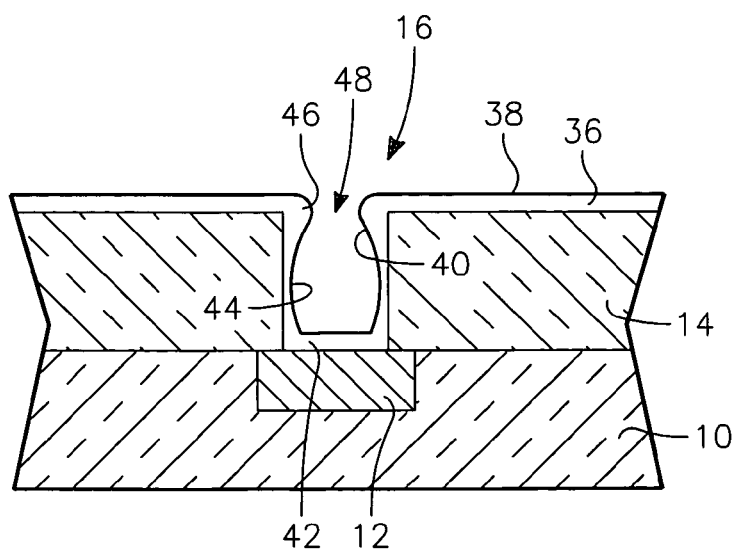
FIG. 3 is a cross sectional view of a via structure showing the typical types of non-uniformity of sputter deposition.
Figure 4:
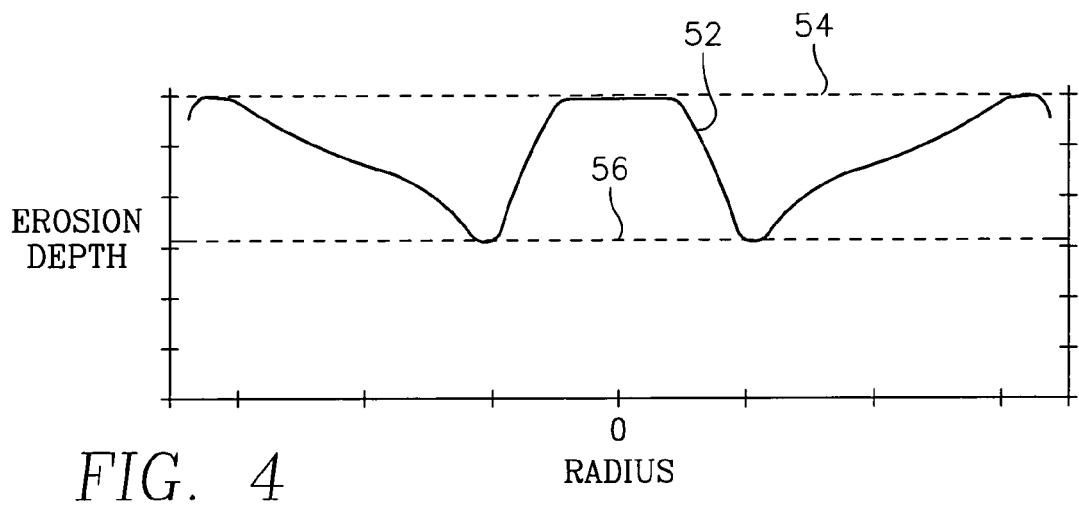
FIG. 4 is a plot of a radial erosion pattern of a sputtering target.

The magnetron 60 has been used to coat metal into high aspect-ratio holes using the general type of sputter reactor 80 shown in FIG. 14. Performance has been observed to be superior. With reference to FIG. 3, the greatest improvement over conventional or even SIP magnetrons is a dramatic reduction in the overhang 46. This improvement will enable sputtering into holes having even higher aspect ratios. Further, the minimum thickness 42 has been increased to provide a more uniform sidewall portion 44, and the thickness of the bottom portion 42 has also increased. These effects are believed to all derive from the higher plasma densities achievable with a smaller magnet assembly.

Figure 16:
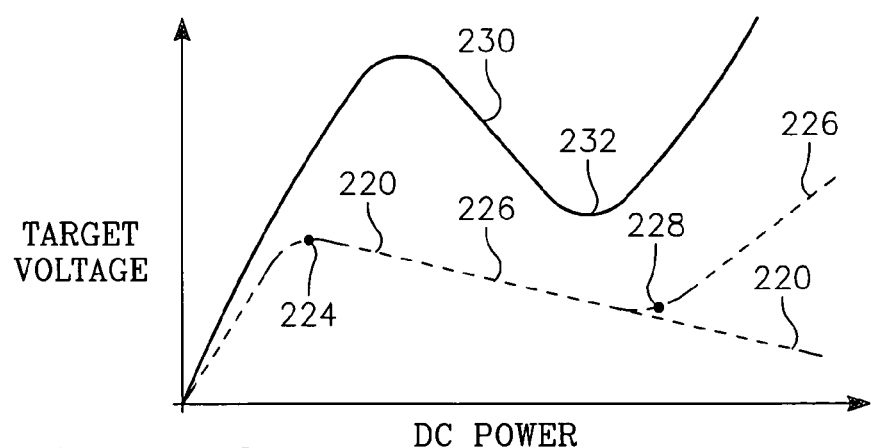
FIG. 16 is a chart plotting the electrical characteristics produced by three types of magnetrons.

The operation of the inventive magnetron can be explained with reference to the graph of FIG. 16 which plots for three different magnetrons when used in a plasma sputter reactor the respective target voltage as a function of the amount of DC power applied to the target, thus in some sense plotting the plasma impedance as a function of power. A conventional magnetron producing a relatively lower density plasma and a very lower ionization fraction for the metal atoms produces a curve 220 which rises to a peak 224 and then falls monotonically back toward zero. An SIP magnetron producing a medium density plasma and a moderate ionization fraction, perhaps of 20%, produces a curve 226, which also falls monotonically from the peak 224 but only until a transition point 228 is passed. Above the transition point 228, the target voltage begins to rise. The rise above the transition point 228 is believed to be caused by the increased density of metal ions. Operation above the transition point 228 is desired to produce a high metal ionization fraction, which promotes sputtering into high aspect-ratio holes.

The very small magnetron achievable with the invention produces a curve 230 similar to that of the SIP magnetron. However, its transition point 232 occurs at a substantially lower power. This indicates that it produces a yet higher metal ionization fraction. The lower transition point 232 further also allows operation in the desired regime with a substantially reduced amount of power.

Figure 17:
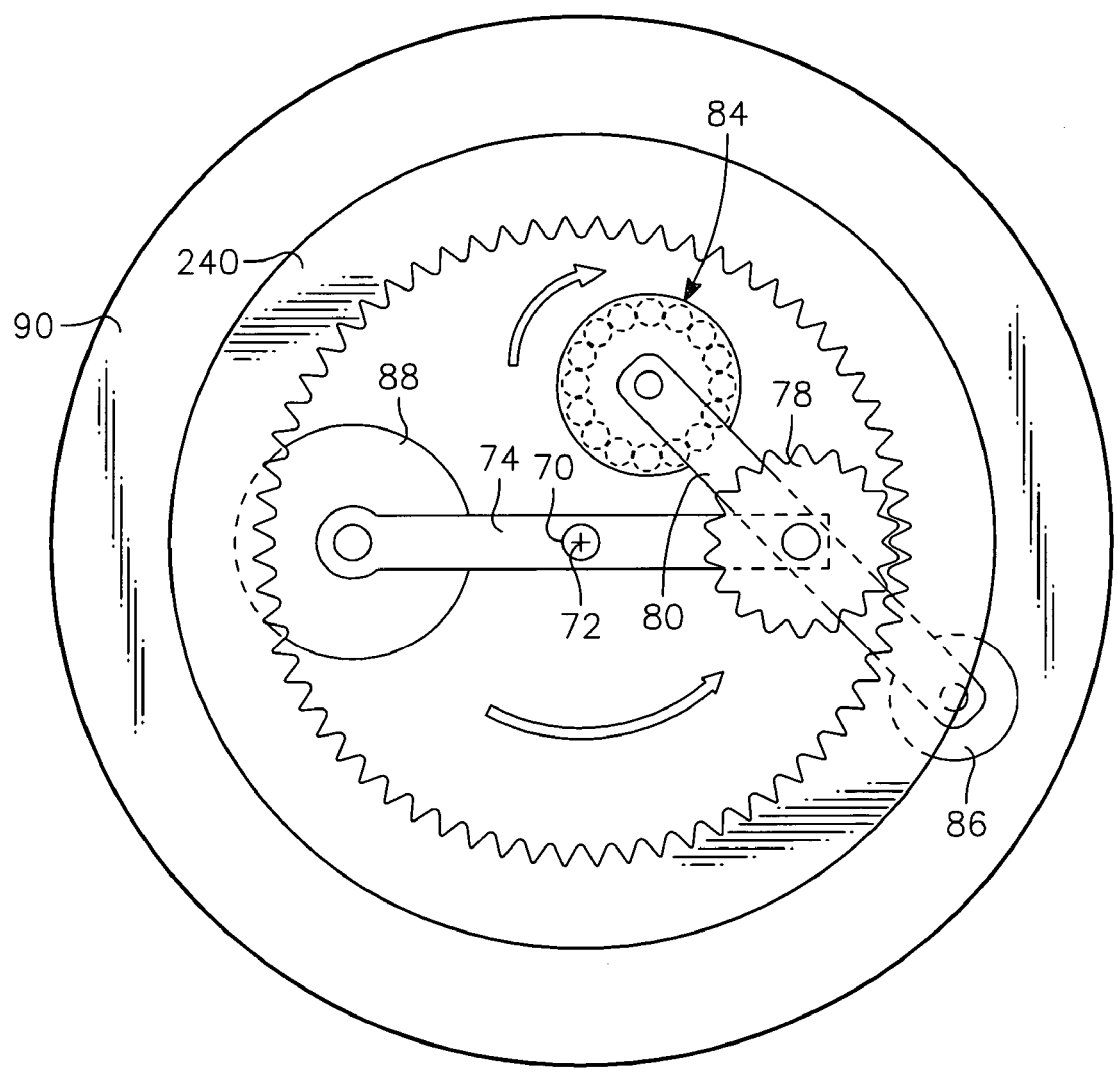
FIG. 17 is a top plan view of another type of geared planetary mechanism.

Other types of geared planetary mechanisms are possible. One alternative uses an external fixed gear. As illustrated in the top plan view in FIG. 17, the drive plate 74 is held on and rotated by the motor drive shaft 70. It rotatably supports the follower gear 78 on its end with no other gears between it and the central axis 72. Instead the follower gear 78 engages an external fixed gear 240 having teeth on its interior. The magnet assembly 84, its bottom plate 80 and counterbalance 86 and the primary counterbalance 88 can pass beneath the fixed external gear 240, and the magnet assembly 84 can pass through the center axis 72. The support mechanism for the fixed external gear 240 is not shown but would extend over the periphery of the target 90. The illustrated planetary mechanism provides the desired retrograde planetary motion with a very simple mechanism. This mechanism differs from the Tomer planetary mechanism in that the present magnet assembly 84 is very small and its magnet portions pass through the central axis 72 rather than Tomer's large magnetron oscillating about the center. The illustrated planetary mechanism does not include an idler gear. However, two of them may be included. They assist in bringing the gear ratio to smaller values as well as providing an additional design freedom.

Figure 18:
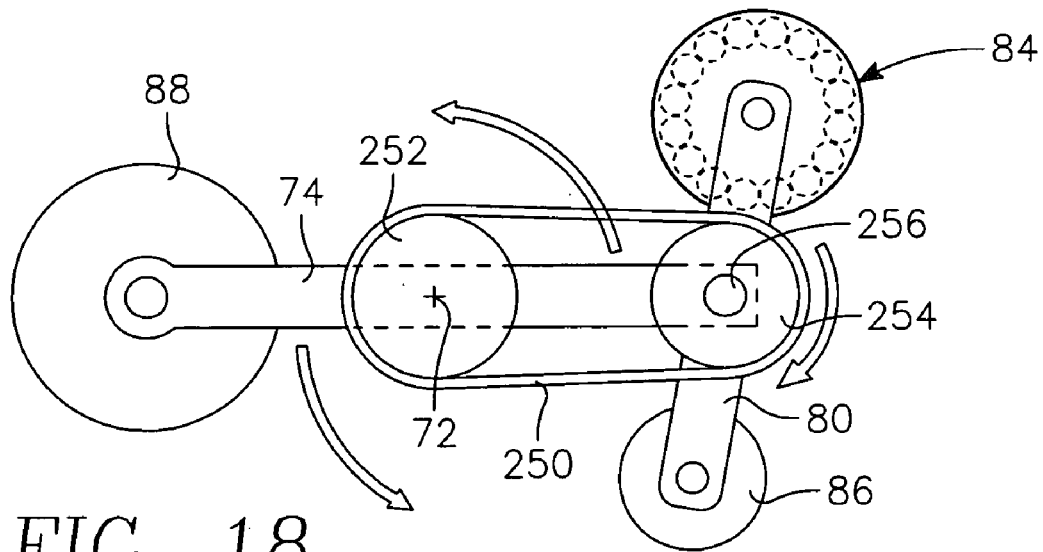
FIG. 18 is a top plan view of a belted planetary magnetron.

It is also possible to achieve the desired planetary motion with a belt and pulley arrangement in which different wheels are engaged by the belt rather than through gear teeth. An embodiment illustrated in top plan view in FIG. 18 includes a belt 250 wrapped around a stationary or fixed capstan 252 and a follower pulley 254 rotatably supported on the drive plate 72. The bottom plate 80 is attached to a shaft 256 of the follower pulley 254 so that the magnetron 86 executes planetary motion. The ratio of the rotation rates of follower pulley 254 and the drive plate 74, akin to the gear ratio of the geared planetary mechanism, is determined by the ratio of the diameters of the stationary capstan 252 and the follower pulley 254. The planetary motion is retrograde without the use of an idler. A belt will be interpreted to include a pulley belt, ridged belt, metal belt, chain, chain belt, cable, band, or other flexible structure that wraps around two generally circular members at least one of which is rotatable and engages both of them. The geared and belted embodiments share the common functions of circular members that rotatably engage with each other either through teeth on a gear wheel or shaft or through a belt wrapped around a pulley wheel or shaft. A more general concept for rotation ratios including both the geared and belted embodiments is an engagement ratio between the innermost circular member and the follower circular member. If desired, the capstan 252 can be connected to a second coaxial drive shaft to allow dynamic control of the magnetron trajectory and full coverage period.

The planetary mechanism is not limited to the described geared and belted embodiments as long as the mechanism achieves the desired planetary motion of the magnetron. Further, even more complicated planetary motions are possible, such as elliptical paths or three-axis planetary motion provided by a third rotational arm such as that occurring on the surface of a rotating moon orbiting a planet. However, the circular two-axis planetary motion provided by the three described embodiments of the mechanism when properly optimized seems more than adequate for most sputtering applications.

Figure 19:
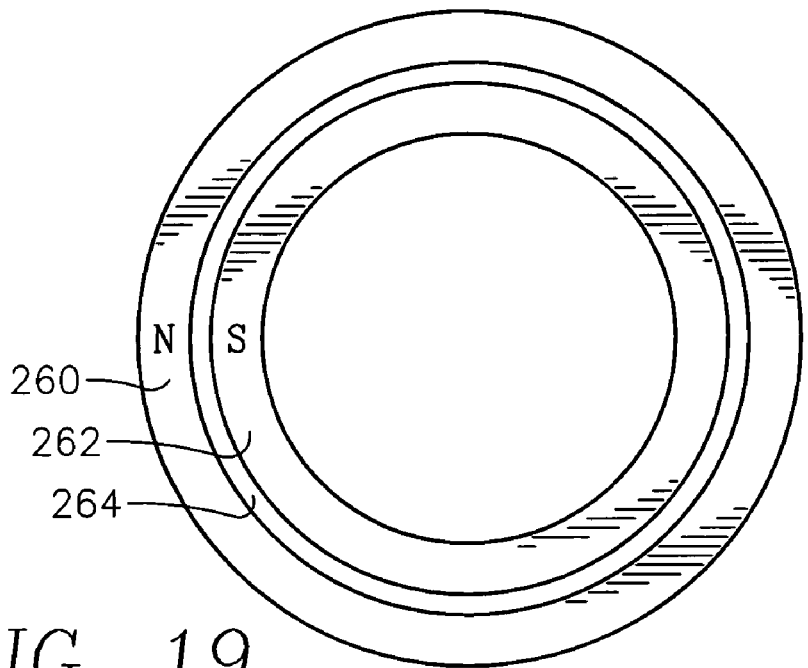
FIG. 19 is a bottom plan view a balanced narrow-gap circular magnet assembly.

Although the planetary mechanism is particularly useful for unbalanced magnetrons useful in deep hole filling, it can also be advantageously be applied to balanced magnetrons more useful for blanket coverage. For example, as illustrated in FIG. 19, the magnet assembly may include two concentric circular band-shaped magnetic poles faces 260, 262 of opposite magnetic polarities separated by a gap 264. The underlying magnets may be either horseshoe magnets arranged in a circle or may be pairs of anti-parallel cylindrical magnets magnetically coupled by a magnetic yoke. This same magnetic construction is typically used in the conventional kidney-shaped magnetrons of considerably larger size. The planetary scanning provides uniform sputtering and full utilization of a target with a much smaller circular balanced magnetron. Furthermore, a relatively high density plasma is usually desired for fast sputtering rates. A small-area magnetron allows a relatively modest power supply to produce a high effective power density and hence high plasma density in the area of target adjacent the small scanned magnetron. The smaller power supply also advantageously reduces the chilling capacity required to maintain the target at a reasonable temperature.

The planetary mechanism of whatever design can be used with a wide range of magnet configurations, for example, balanced vs. unbalanced, high vs. lower plasma densities, and thick vs. thin sputter deposition thicknesses so that a universal planetary mechanism can be applied to a range of sputtering applications, thereby enabling an economical scanning design and reducing the parts inventory. A simple substitution of different gears or pulleys on an otherwise universal design permits variations in coverage patterns and velocity ratios.

The planetary mechanism can also drive non-circular magnetrons, such as triangular ones, whose shapes have been further optimized for uniformity and other reasons.

Although the mechanism has been explained with reference to a scanning magnetron having a planetary motion about a central axis, other mechanisms are obtainable in which the scanning is performed both radially and circumferentially of the central axis and in which at least part of the magnet assembly passes over the central axis. Such mechanisms include a radially acting actuator for the magnet assembly and a circumferentially rotating drive plate The planetary magnetron motion allows high-performance sputtering with a relatively simple flat target in contrast to complexly shaped and hence expensive hollow-cathode or annularly vaulted targets. However, a planetary magnetron may be advantageously used with more complex targets, especially hollow-cathode targets, to increase the uniformity of roof sputtering while decreasing the power requirements.

The invention thus promotes uniform sputtering and increased target utilization. It also permits the use of very small magnetrons, thus providing high plasma densities with relatively small power supplies without sacrifice of sputtering uniformity and target utilization. All these features can be obtained with a universal magnetron design.

The invention claimed is:

1. An oscillating magnetron configured for used with a sputtering target generally symmetric about a central axis for use in a magnetron sputter reactor generally symmetrically arranged around said central axis, comprising:
   a magnet assembly disposed above the taraget and comprising
      a closed inner magnetic pole substantially circularly symmetric about a magnet axis with no substantial apertures therethrough and having a first magnetic polarity along said central axis and a first total magnetic intensity, and
      an outer magnetic pole substantially circularly symmetric about the magnet axis and surrounding said inner magnetic pole and having a second magnetic polarity opposed to said first magnetic polarity and a second total magnetic intensity; and
   a scanning mechanism moving said magnet assembly in a path extending both radially and circumferentially of said central axis, wherein said scanning mechanism includes a rotary shaft disposed radially inside with respect to the central axis of gears of the scanning mechanism and passing along and rotating about the central axis and providing the sole motive power for said scanning mechanism, and
      wherein the magnet assembly and the scanning mechanism are supported solely through an upper end of the rotary shaft above the scan mechanism and a lower end of the rotary shaft is not supported.

2. The magnetron of claim 1, wherein said scanning mechanism is a planetary scanning mechanism moving a point of said magnet assembly in a planetary motion about said central axis.

3. The magnetron of claim 2, wherein said planetary motion is a retrograde planetary motion.

4. The magnetron of claim 1, wherein the second total magnetic intensity is at least 150% of said first magnetic intensity.

5. An oscillating magnetron configured for used with a sputtering target generally symmetric about a central axis for use in a magnetron sputter reactor generally symmetrically arranged around said central axis, comprising:
   a magnet assembly comprising
      an a substantially symmetric and closed inner magnetic pole having a first magnetic polarity along said central axis and a first total magnetic intensity, and
      an outer magnetic pole surrounding said inner magnetic pole and having a second magnetic polarity opposed to said first magnetic polarity and a second total magnetic intensity at least 150% of said first magnetic intensity; and
   a planetary scanning mechanism moving a point of said magnet assembly in a planetary motion about said central axis in a path extending both radially and circumferentially of said central axis, wherein said planetary scanning mechanism includes a fixed gear, a rotary drive shaft extending along said central axis, a first plate fixed to said rotary drive shaft, an idler gear rotatably supported on said first plate and engaged with said fixed gear, a follower gear rotatably supported on said first plate and engaged with said idler gear, and a second plate fixed to said follower gear, wherein said magnet assembly is fixed to said second plate at a position away from an axis of said follower gear.

6. An oscillating magnetron configured for used with a sputtering target generally symmetric about a central axis for use in a magnetron sputter reactor generally symmetrically arranged around said central axis, comprising:
   a planetary scanning mechanism including
      a fixed gear arranged around said central axis and fixed to said reactor,
      a rotary drive shaft extending along said central axis,
      a first member fixed to said rotary drive shaft,
      an idler gear rotatably supported on said first member and engaged with said fixed gear,
      a follower gear rotatably supported on said first member and engaged with said idler gear,
      a second member fixed to said follower gear; and
   a magnet assembly fixed to said second member at a position away from an axis of said follower gear.

7. The magnetron of claim 6, wherein said planetary scanning mechanism is configured such that a length of said second member and a point of attachment of said magnet assembly to said second member can be selected to pass said magnet assembly through said central axis.

8. A rotating magnetron configured for use with a sputtering target, comprising:
   a magnet assembly having multiple opposed magnetic poles arranged in a plane and including inner and outer pole pieces underlain by respective magnets of opposed magnetic polarities; and
   a planetary mechanism at least partially supported and rotated by a first shaft extending along a central axis perpendicular to said plane and mounting said magnet assembly in a position to perform planetary motion about said central axis,
      wherein said planetary mechanism includes a member mounting said magnet assembly and rotatable about a follower axis and further mounting a counterbalance mounted on a portion of said member opposite said magnet assembly with respect to said follower axis and counterbalancing said magnet assembly in rotation about said follower axis.

9. A rotating magnetron configured for use with a sputtering target, comprising:
   a magnet assembly having multiple opposed magnetic poles arranged in a plane; and
   a planetary mechanism at least partially supported and rotated by a first shaft extending along a central axis perpendicular to said plane and mounting said magnet assembly in a position to perform retrograde planetary motion about said central axis, wherein said planetary mechanism includes a member mounting said magnet assembly and rotatable about a follower axis and further mounting a counterbalance mounted on a portion of said member opposite said magnet assembly with respect to said follower axis and counterbalancing said magnet assembly in rotation about said follower axis.

10. The magnetron of claim 9, wherein said planetary motion includes a orbital component and planetary rotational component having an opposite rotational direction than said orbital component.

11. The magnetron of claim 10, wherein a rotational rate ratio between said planetary rotational component and said orbital component about respective axes is in a range of 1.03 to 5.

12. The magnetron of claim 11, wherein said rotation rate ratio is not an integer.

13. A rotating magnetron configured for use with a sputtering target, comprising:
   a magnet assembly having multiple opposed magnetic poles arranged in a plane; and
   a planetary mechanism at least partially supported and rotated by a first shaft extending along a central axis perpendicular to said plane and mounting said magnet assembly in a position to perform planetary motion about said central axis, wherein said planetary mechanism includes a member mounting said magnet assembly and rotatable about a follower axis and further mounting a counterbalance mounted on a portion of said member opposite said magnet assembly with respect to said follower axis and counterbalancing said magnet assembly in rotation about said follower axis, and wherein said planetary mechanism comprises:

a first gear arranged around said central axis;

a drive member fixed to said first shaft and rotated thereby;

an idler gear rotatably supported by said drive member and engaging said fixed gear;

a follower gear rotatably supported by said drive member and engaging said idler gear; and a support plate rotating with said follower gear and supporting said magnet assembly.

14. The magnetron of claim 13, wherein said first gear is rotatable.

15. The magnetron of claim 13, wherein said first gear is fixed.

16. The magnetron of claim 15, wherein a gear ratio between a first one and a second one of said first gear and said follower gear is greater than 1.03 and is not an integer.

17. The magnetron of claim 16, wherein said gear ratio is in a range of 1.03 to 6.

18. The magnetron of claim 17, wherein gear ratio is in a range of between 2.5 to 4.97

19. The magnetron of claim 13, wherein said idler and follower gears are disposed on a first side of said drive member and said support plate is disposed on a second side of said drive member.

20. The magnetron of claim 19, further comprising a counterbalance disposed on a second side of said drive support plate with respect to a rotation axis of said support plate on said drive member and counterbalancing said magnet assembly.

21. A rotating magnetron configured for use with a sputtering target, comprising:

a magnet assembly having multiple opposed magnetic poles arranged in a plane; and a planetary mechanism at least partially supported and rotated by a first shaft extending along a central axis perpendicular to said plane and mounting said magnet assembly in a position to perform planetary motion about said central axis, wherein said planetary mechanism includes a member mounting said magnet assembly and rotatable about a follower axis and further mounting a counterbalance mounted on a portion of said member opposite said magnet assembly with respect to said follower axis and counterbalancing said magnet assembly in rotation about said follower axis, and wherein said planetary mechanism comprises:

a first gear arranged around said central axis and having teeth on an interior surface facing said central axis;

a drive member fixed to said first shaft and rotated thereby, a follower gear rotatably supported engaging said first gear; and a support plate rotating with said follower gear and supporting said magnet assembly.

* * * * *